United States Patent
Shen

(10) Patent No.: US 7,538,419 B2
(45) Date of Patent: May 26, 2009

(54) STACKED-TYPE CHIP PACKAGE STRUCTURE

(75) Inventor: Geng-Shin Shen, Tainan Science-Based Industrial Park (TW)

(73) Assignees: ChipMOS Technologies Inc., Hsinchu (TW); ChipMOS Technologies (Bermuda) Ltd., Hamilton (BE)

( * ) Notice: Subject to any disclaimer, the term of this patent is extended or adjusted under 35 U.S.C. 154(b) by 0 days.

(21) Appl. No.: 11/684,543

(22) Filed: Mar. 9, 2007

(65) Prior Publication Data

US 2007/0152317 A1    Jul. 5, 2007

Related U.S. Application Data

(62) Division of application No. 11/255,710, filed on Oct. 19, 2005, now Pat. No. 7,385,282.

(51) Int. Cl.
*H01L 23/02* (2006.01)

(52) U.S. Cl. ............... 257/686; 257/737; 257/777; 257/778; 257/E23.018; 257/E23.027; 257/E23.085; 257/E25.006; 257/E25.027

(58) Field of Classification Search ............... 257/686, 257/737, E23.03, E25.006, E25.027, E23.018, 257/E23.085, 778, 777

See application file for complete search history.

(56) References Cited

U.S. PATENT DOCUMENTS

| | | | | |
|---|---|---|---|---|
| 6,259,036 | B1 * | 7/2001 | Farnworth | 174/260 |
| 6,847,105 | B2 * | 1/2005 | Koopmans | 257/686 |
| 7,138,706 | B2 * | 11/2006 | Arai et al. | 257/678 |
| 2001/0003375 | A1 * | 6/2001 | Kovats et al. | 257/685 |
| 2003/0001252 | A1 * | 1/2003 | Ku et al. | 257/686 |
| 2005/0006789 | A1 * | 1/2005 | Tomono et al. | 257/778 |
| 2007/0063344 | A1 * | 3/2007 | Lin et al. | 257/737 |

\* cited by examiner

*Primary Examiner*—Long K Tran
(74) *Attorney, Agent, or Firm*—J.C. Patents

(57) ABSTRACT

A stacked-type chip package structure including a substrate, a first chip, bonding wires, a second chip and B-stage conductive bumps is provided. The first chip is disposed on the substrate, and it has first bonding pads disposed on an active surface thereof. Besides, the first bonding pads are electrically connected to the substrate through the bonding wires. The second chip is disposed above the first chip, and it has second bonding pads disposed on an active surface thereof. The second bonding pads of the second chip are electrically connected to the first bonding pads of the first chip through the B-stage conductive bumps respectively, and each B-stage conductive bump covers a portion of the corresponding bonding wire.

7 Claims, 3 Drawing Sheets

STACKED-TYPE CHIP PACKAGE STRUCTURE

CROSS-REFERENCE TO RELATED APPLICATION

This application is a divisional application of, and claims the priority benefit of, U.S. application Ser. No. 11/255,710 filed on Oct. 19, 2005 Now U.S. Pat. No. 7,385,282.

BACKGROUND OF THE INVENTION

1. Field of the Invention

The present invention generally relates to a chip package structure, in particular, to a stacked-type chip package structure.

2. Description of Related Art

In this information explosion age, the market of multimedia applications rapidly expands. The integrated circuit (IC) package needs to be developed in accordance with the trends of digitalization, network localization, user friendliness and so on. In order to satisfy the aforementioned requirements, electronic devices must achieve the goals of high operating speed, multiple functions, higher integration, miniaturization, light weight, and low cost. Therefore, high-density packages, such as ball grid arrays (BGAs), chip scale packages (CSPs), flip chips, and stack-type multi-chip package modules are developed.

FIG. 1 is a schematic cross-sectional view of a conventional stacked-type chip package structure. Please refer to FIG. 1, the stacked-type chip package structure 100 mainly comprises a substrate 110, a first chip 120, a second chip 130, a spacer 140, a plurality of first bonding wires 150, a plurality of second bonding wires 160 and a molding compound 180. The substrate 110 has a first surface 110a and a second surface 110b. The first chip 120 is adhered to the first surface 110a of the substrate 110 through an adhesive layer 170, and is electrically connected to the substrate 110 through the first bonding wires 150. Similarly, the second chip 130 is disposed above the first chip 120, and is electrically connected to the substrate 110 through the second bonding wires 160.

The spacer 140 is disposed between the first chip 120 and the second chip 130 for fixing the second chip 130 on the first chip 110 and protecting the first bonding wire 150 from damage. The molding compound 180 is disposed on the substrate 110 and covers the first chip 110, the second chip 130, the first bonding wires 150 and the second bonding wires 160 for protecting them from damage and humidity. Furthermore, a plurality of solder balls 190 are disposed on the other side of the substrate 110, and therefore the stacked-type chip package structure 100 can be electrically connected to other electronic devices (not shown) via the solder balls 190.

The above-mentioned stacked-type chip package structure 100 utilizes the spacer 140 for placing the second chip 130 on the first chip 110 and protecting the first bonding wires 150 from damage. However, the height of the chip package structure is unable to be lower due to the usage of the spacer 140, and the volume of the chip package is unable to be compact, too. Therefore, the solution of how to make the stacked-type chip package structure more compact is highly desired in the technology of IC package.

SUMMARY OF THE INVENTION

A main purpose of the present invention is to provide a stacked-type chip package structure. The chip package structure utilizes B-stage conductive bumps for electrically connecting one chip and the other chip, to minimize the volume of the chip package structure.

A second purpose of the present invention is to provide a stacked-type chip package structure, for making the chip package structure more compact.

As embodied and broadly described herein, the present invention provides a stacked-type chip package structure comprising a substrate, a first chip, a plurality of bonding wires, a second chip and a plurality of B-stage conductive bumps. The first chip is disposed on the substrate, and it has a plurality of first bonding pads disposed on an active surface thereof. Besides, the first bonding pads are electrically connected to the substrate through the bonding wires. The second chip is disposed above the first chip, and it has a plurality of second bonding pads disposed on an active surface thereof. The second bonding pads of the second chip are electrically connected to the first bonding pads of the first chip through the B-stage conductive bumps respectively, and each B-stage conductive bump covers a portion of the corresponding bonding wire.

According to an embodiment of the present invention, the substrate has a first surface and a second surface, the first chip is disposed on the first surface of the substrate, and the substrate comprises a plurality of solder balls disposed on the second surface thereof.

According to an embodiment of the present invention, the glass transition temperature of the B-stage conductive bumps is between $-40°$ C.$\sim 175°$ C.

According to an embodiment of the present invention, the stacked-type chip package structure further comprises an adhesive layer, wherein the first chip is adhered to the substrate through the adhesive layer.

According to an embodiment of the present invention, the stacked-type chip package structure further comprises a molding compound disposed on the substrate and covering the first chip, the second chip and the bonding wires.

As embodied and broadly described herein, the present invention provides a stacked-type chip package structure comprising a substrate, a first chip, a plurality of bonding wires, a second chip and a plurality of B-stage conductive bumps. The first chip is disposed on the substrate, and it has a plurality of first bonding pads and a plurality of second bonding pads disposed on an active surface thereof. The first bonding pads are electrically connected to the substrate through the bonding wires. The second chip is disposed above the first chip, and it has a plurality of third bonding pads disposed on an active surface thereof. The third bonding pads of the second chip are electrically connected to the second bonding pads of the first chip through the B-stage conductive bumps respectively.

According to an embodiment of the present invention, the first chip further comprises a redistributed layer (RDL), and the first bonding pads are electrically connected to the second bonding pads through the RDL.

According to an embodiment of the present invention, the substrate has a first surface and a second surface, the first chip is disposed on the first surface of the substrate, and the substrate comprises a plurality of solder balls disposed on the second surface thereof.

According to an embodiment of the present invention, the stacked-type chip package structure further comprises an adhesive layer. The first chip is adhered to the substrate through the adhesive layer.

According to an embodiment of the present invention, the stacked-type chip package structure further comprises a molding compound. The molding compound is disposed on the substrate and covers the first chip, the second chip and the bonding wires.

According to an embodiment of the present invention, the glass transition temperature of the B-stage conductive bumps is between −40° C.~175° C.

In summary, the stacked-type chip package structure of the present invention utilizes the B-stage conductive bumps for electrical connecting two chips arranged with their active surfaces face to face. Therefore, the height of the chip package structure can be reduced, and the volume thereof can be more compact, too. Besides, the B-stage conductive bumps not only can be adapted for electrical connecting two chips, but also covers a portion of the bonding wires for protecting them from being pressed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
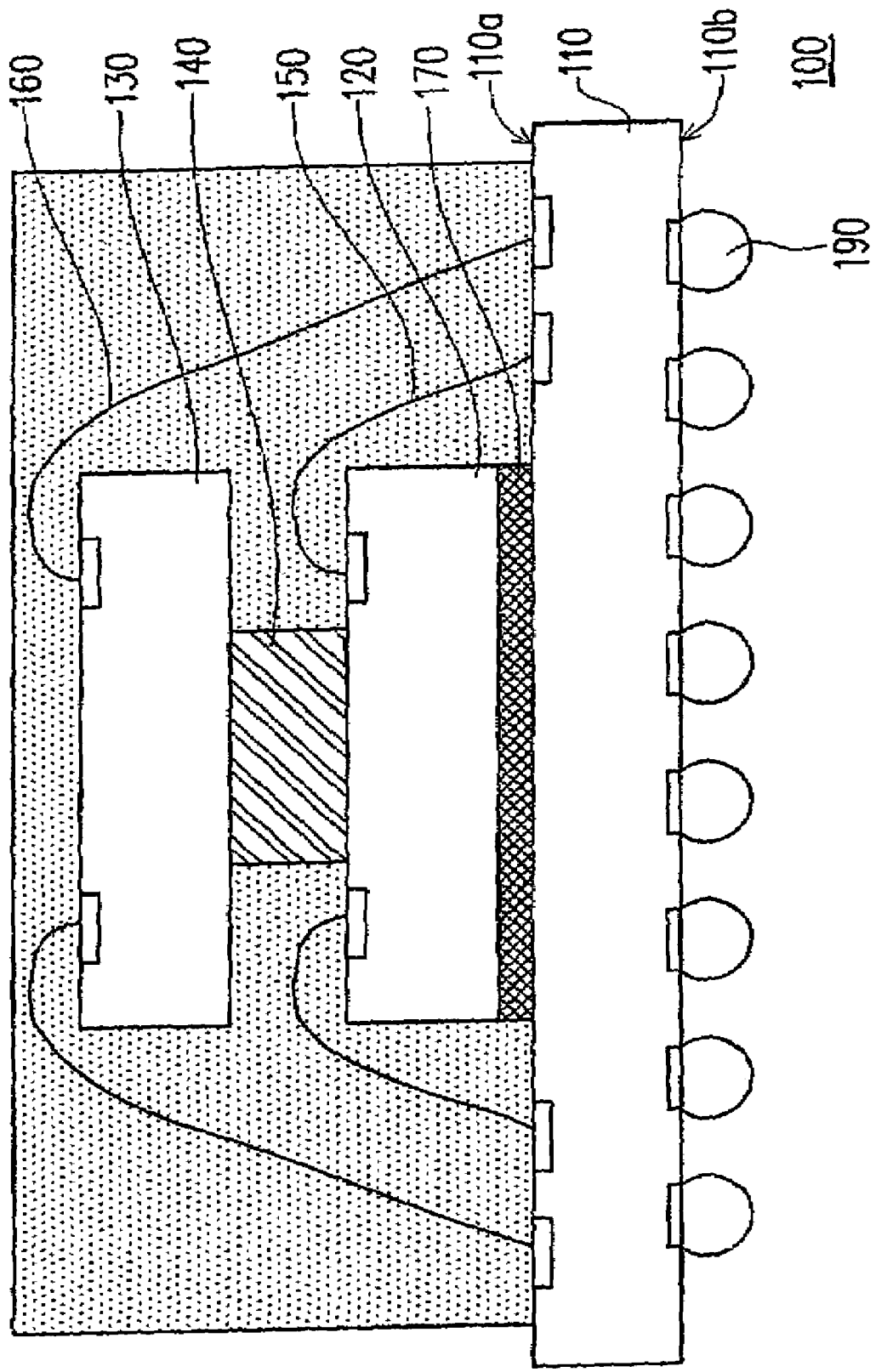
FIG. 1 is a schematic cross-sectional view of a conventional stacked-type chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
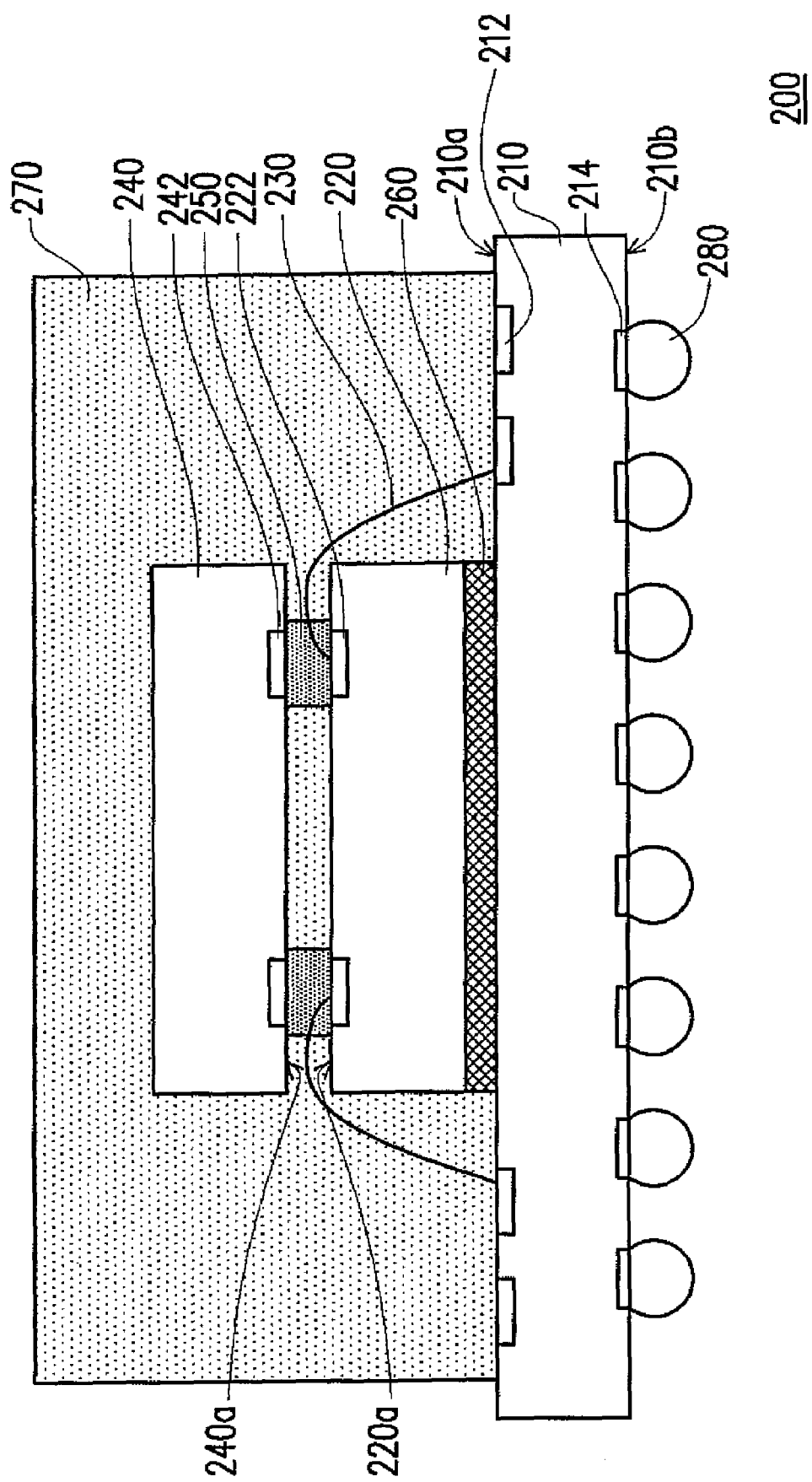
FIG. 2 is a schematic cross-sectional view of a stacked-type chip package structure according to the first embodiment of the present invention.

FIG. 2 is a schematic cross-sectional view of a stacked-type chip package structure according to the first embodiment of the present invention. Please refer to FIG. 2, the stacked-type chip package structure 200 of the present invention mainly comprises a substrate 210, a first chip 220, a plurality of bonding wires 230, a second chip 240 and a plurality of B-stage conductive bumps 250. The substrate 210 has a plurality of first bonding pads 212 and a plurality of second bonding pads 214 disposed on its first surface 210a and second surface 210b respectively. The first chip 220 is disposed on the first surface 210a of the substrate 210, and it has a plurality of third bonding pads 222 disposed on its active surface 220a. In one embodiment of the present invention, the first chip 220 is adhered to the substrate 210 through an adhesive layer 260. However, the first chip 220 can be fixed on the substrate 210 by other method. The way of fixing the first chip 220 on the substrate 210 is not limited in the present invention. The third bonding pads 222 of the first chip 220 are electrically connected to the first bonding pads 212 of the substrate 210 through the bonding wires 230 respectively. The bonding wires 230 are formed by wire bonding technology, and the material of the bonding wires 230 can be gold.

The second chip 240 is disposed above the first chip 220, and its active surface 240a faces the active surface 220a of the first chip 220. The second chip 240 has a plurality of fourth bonding pads 242 disposed on its active surface 240a. The B-stage conductive bumps 250 are disposed between the first chip 220 and the second chip 240 for electrically connecting the fourth bonding pads 242 of the second chip 240 and the third bonding pads 222 of the first chip 220 respectively. Each B-stage conductive bump 250 also covers a portion of the corresponding bonding wire 230 for protecting the bonding wire 230 from being pressed, to ensure the electrical connection between the first chip 220 and the second chip 240. Besides, the glass transition temperature of the B-stage conductive bumps 250 is between −40□~175□.

The stacked-type chip package structure 200 further comprises a molding compound 270 disposed on the substrate 210 and covering the first chip 220, the second chip 240 and the bonding wires 230, for protecting them from damage and humidity. Furthermore, the substrate 210 may comprise a plurality of solder balls 280 disposed on the second bonding pads 214 thereof. Thus, the stacked-type chip package structure 200 can be electrically connected to other electronic devices, carriers and the like through the solder balls 280.

Figure 3:
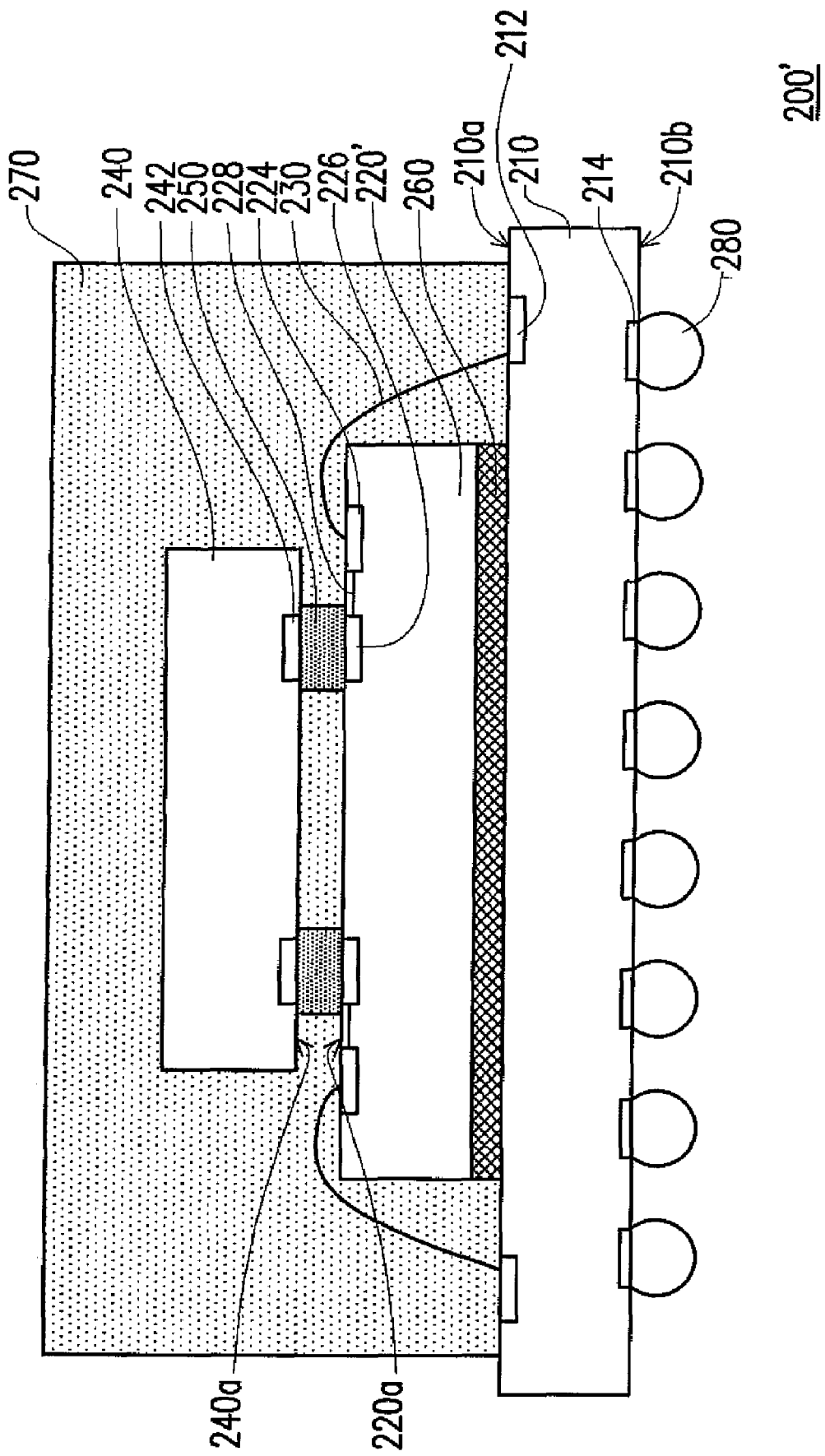
FIG. 3 is a schematic cross-sectional view of a stacked-type chip package structure according to the second embodiment of the present invention.

FIG. 3 is a schematic cross-sectional view of a stacked-type chip package structure according to the second embodiment of the present invention. Please refer to FIG. 3, the stacked-type chip package structure 200' of the second embodiment is similar to that of the first embodiment. The difference between them is that the first chip 220' of the second embodiment further comprises a plurality of fifth bonding pads 224 and a plurality of sixth bonding pads 226. As shown in FIG. 3, the fifth bonding pads 224 of the first chip 220' are electrically connected to the first bonding pads 212 of the substrate 210 through the bonding wires 230, and the fourth bonding pads 242 of the second chip 240 are electrically connected to the sixth bonding pads 226 of the first chip 220' through the B-stage conductive bumps 250. Besides, the first chip 220' further comprises a redistributed layer (RDL) 228. Thus, the fifth bonding pads 224 are electrically connected to the sixth bonding pads 226 through the RDL 228.

In summary, the stacked-type chip package structure of the present invention utilizes the B-stage conductive bumps for electrical connecting two chips arranged with their active surfaces face to face. Therefore, the height of the chip package structure can be reduced, and the volume thereof can be more compact, too. Besides, the B-stage conductive bumps not only can be adapted for electrical connecting two chips, but also covers a portion of the bonding wires for protecting them from being pressed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked-type chip package structure, comprising:
   a substrate, having a dielectric layer and a plurality of connection pads;
   a first chip disposed on the substrate, the first chip having a plurality of first bonding pads and a plurality of second bonding pads disposed on an active surface thereof, wherein the first chip further comprises a redistributed layer (RDL), and at least one of the first bonding pads is electrically connected to at least one of the second bonding pads through the RDL;
   a plurality of bonding wires, wherein the first bonding pads are electrically connected to the connection pads of the substrate through the bonding wires;
   a second chip disposed above the first chip, the second chip having a plurality of third bonding pads disposed on an active surface thereof; and a plurality of B-stage conductive bumps, wherein the third bonding pads of the second chip are electrically connected to the second bonding pads of the first chip through the B-stage conductive bumps respectively and at least one of the B-stage conductive bumps at least fully cover areas of a corresponding one of the second bonding pads and a corresponding one of the third bonding pads, wherein the B-stage conductive bumps also covers at least a portion of redistributed layer.

2. The stacked-type chip package structure according to claim 1, wherein the substrate has a first surface and a second surface, the first chip is disposed on the first surface of the substrate, and the substrate comprises a plurality of solder balls disposed on the second surface thereof.

3. The stacked-type chip package structure according to claim 1, further comprising an adhesive layer, wherein the first chip is adhered to the substrate through the adhesive layer.

4. The stacked-type chip package structure according to claim 1, further comprising a molding compound disposed on the substrate and covering the first chip, the second chip and the bonding wires.

5. The stacked-type chip package structure according to claim 1, wherein the glass transition temperature of the B-stage conductive bumps is −40° C.~175° C.

6. The stacked-type chip package structure according to claim 1, wherein a contact area of the B-stage conductive bumps between the first chip and the second chip is larger than areas of the second and the third bonding pads.

7. The stacked-type chip package structure according to claim 1, wherein pad surfaces of the second bonding pad and the third bonding pad are coplanar to chip surfaces of the first chip and the second chip.

* * * * *